(12) United States Patent
Shin et al.

(10) Patent No.: US 9,659,909 B2
(45) Date of Patent: May 23, 2017

(54) SEMICONDUCTOR PACKAGES INCLUDING FLEXIBLE WING INTERCONNECTION SUBSTRATE

(71) Applicant: SK hynix Inc., Icheon-si, Gyeonggi-do (KR)

(72) Inventors: Hee Min Shin, Seongnam-si (KR); Mi Young Kim, Gunpo-si (KR)

(73) Assignee: SK hynix Inc., Icheon-Si (KR)

( * ) Notice: Subject to any disclaimer, the term of this patent is extended or adjusted under 35 U.S.C. 154(b) by 1 day.

(21) Appl. No.: 15/013,553

(22) Filed: Feb. 2, 2016

(65) Prior Publication Data

US 2017/0084579 A1    Mar. 23, 2017

(30) Foreign Application Priority Data

Sep. 21, 2015  (KR) .................. 10-2015-0132792

(51) Int. Cl.
| | |
|---|---|
| *H01L 23/498* | (2006.01) |
| *H01L 23/495* | (2006.01) |
| *H01L 51/00* | (2006.01) |
| *H01L 41/047* | (2006.01) |
| *H01L 23/538* | (2006.01) |
| *H01L 23/00* | (2006.01) |
| *H01L 25/065* | (2006.01) |
| *H01L 23/48* | (2006.01) |
| *H01L 23/31* | (2006.01) |

(52) U.S. Cl.
CPC ...... *H01L 25/0657* (2013.01); *H01L 23/3128* (2013.01); *H01L 23/481* (2013.01); *H01L 23/4985* (2013.01); *H01L 23/49572* (2013.01); *H01L 23/49833* (2013.01); *H01L 23/49838* (2013.01); *H01L 23/5384* (2013.01); *H01L 23/5386* (2013.01); *H01L 23/5387* (2013.01); *H01L 24/32* (2013.01); *H01L 24/48* (2013.01); *H01L 24/73* (2013.01); *H01L 41/0475* (2013.01); *H01L 51/0097* (2013.01); *H01L 2224/32225* (2013.01); *H01L 2224/48227* (2013.01); *H01L 2224/73265* (2013.01); *H01L 2225/0651* (2013.01); *H01L 2225/0652* (2013.01); *H01L 2225/06548* (2013.01); *H01L 2225/06572* (2013.01)

(58) Field of Classification Search
CPC ............ H01L 23/4985; H01L 23/5387; H01L 51/0097; H01L 41/0475; H01L 2225/107; H01L 23/49572; H01L 24/48; H01L 48/32; H01L 23/49838; H01L 23/5384; H01L 23/5386

See application file for complete search history.

(56) References Cited

U.S. PATENT DOCUMENTS

2005/0280138 A1* 12/2005 Shrivastava ............ H01L 23/50
                                                                    257/697

FOREIGN PATENT DOCUMENTS

| KR | 1020070088674 A | 8/2007 |
| KR | 1020150025633 A | 3/2015 |

* cited by examiner

*Primary Examiner* — Thanhha Pham
(74) *Attorney, Agent, or Firm* — William Park & Associates Ltd.

(57) ABSTRACT

A semiconductor package includes a first semiconductor package, a second semiconductor package disposed on the first semiconductor package, and a flexible wing interconnection substrate disposed between the first and second semiconductor packages.

19 Claims, 9 Drawing Sheets

SEMICONDUCTOR PACKAGES INCLUDING FLEXIBLE WING INTERCONNECTION SUBSTRATE

CROSS-REFERENCE TO RELATED APPLICATIONS

The present application claims priority under 35 U.S.C. 119(a) to Korean Patent Application No. 10-2015-0132792, filed on Sep. 21, 2015, in the Korean Intellectual Property Office, which is incorporated herein by reference in its entirety as set forth in full.

BACKGROUND

1. Technical Field

Embodiments of the invention relate to semiconductor packages and, more particularly, to semiconductor packages including a flexible wing interconnection substrate.

2. Related Art

In the electronics industry, a single unified package including a plurality of semiconductor packages or a plurality of semiconductor chips is increasingly in demand with the development of multi-functional, larger capacitive and smaller semiconductor packages. If the single unified packages are employed in electronic systems, a size of the electronic systems may be reduced. Each of the single unified packages may be realized to have a multi-chip package structure including a plurality of semiconductor chips which are vertically stacked or a package-on-package (PoP) structure including a plurality of semiconductor packages which are vertically stacked. The PoP structure may be realized to include semiconductor packages having different functions. Thus, the PoP structure has been widely used in the electronics industry area.

The package having the PoP structure may be fabricated by attaching a top package onto a bottom package. When the top package is attached onto the bottom package, the top package or the bottom package may warp or bend to cause a joint failure. The joint failure of the top package and the bottom package may lead to an electrical disconnection between the top package and the bottom package. Accordingly, a lot of effort has been focused on improving the reliability of the joint structure of the top package and the bottom package.

SUMMARY

According to an embodiment, a semiconductor package includes a first semiconductor package, a second semiconductor package disposed on the first semiconductor package, and a flexible wing interconnection substrate disposed between the first and second semiconductor packages. The flexible wing interconnection substrate includes a fixing portion, a first flexible wing extending from the fixing portion, and a second flexible wing extending from the fixing portion to be parallel with the first flexible wing. A portion of the first flexible wing is combined with the second semiconductor package, and a portion of the second flexible wing is combined with the first semiconductor package.

According to an embodiment, a semiconductor package includes a first package substrate, a second package substrate disposed on the first package substrate, and a flexible wing interconnection substrate disposed between the first and second package substrates. The flexible wing interconnection substrate includes a fixing portion, a first flexible wing extending from the fixing portion, and a second flexible wing extending from the fixing portion to be parallel with the first flexible wing. A portion of the first flexible wing is combined with the second package substrate, and a portion of the second flexible wing is combined with the first package substrate.

According to an embodiment, there is provided a memory card including a semiconductor package. The semiconductor package includes a first semiconductor package, a second semiconductor package disposed on the first semiconductor package, and a flexible wing interconnection substrate disposed between the first and second semiconductor packages. The flexible wing interconnection substrate includes a fixing portion, a first flexible wing extending from the fixing portion, and a second flexible wing extending from the fixing portion to be parallel with the first flexible wing. A portion of the first flexible wing is combined with the second semiconductor package, and a portion of the second flexible wing is combined with the first semiconductor package.

According to an embodiment, there is provided a memory card including a semiconductor package. The semiconductor package includes a first package substrate, a second package substrate disposed on the first package substrate, and a flexible wing interconnection substrate disposed between the first and second package substrates. The flexible wing interconnection substrate includes a fixing portion, a first flexible wing extending from the fixing portion, and a second flexible wing extending from the fixing portion to be parallel with the first flexible wing. A portion of the first flexible wing is combined with the second package substrate, and a portion of the second flexible wing is combined with the first package substrate.

According to an embodiment, there is provided an electronic system including a semiconductor package. The semiconductor package includes a first semiconductor package, a second semiconductor package disposed on the first semiconductor package, and a flexible wing interconnection substrate disposed between the first and second semiconductor packages. The flexible wing interconnection substrate includes a fixing portion, a first flexible wing extending from the fixing portion, and a second flexible wing extending from the fixing portion to be parallel with the first flexible wing. A portion of the first flexible wing is combined with the second semiconductor package, and a portion of the second flexible wing is combined with the first semiconductor package.

According to an embodiment, there is provided an electronic system including a semiconductor package. The semiconductor package includes a first package substrate, a second package substrate disposed on the first package substrate, and a flexible wing interconnection substrate disposed between the first and second package substrates. The flexible wing interconnection substrate includes a fixing portion, a first flexible wing extending from the fixing portion, and a second flexible wing extending from the fixing portion to be parallel with the first flexible wing. A portion of the first flexible wing is combined with the second package substrate, and a portion of the second flexible wing is combined with the first package substrate.

DETAILED DESCRIPTION

Figure 1:
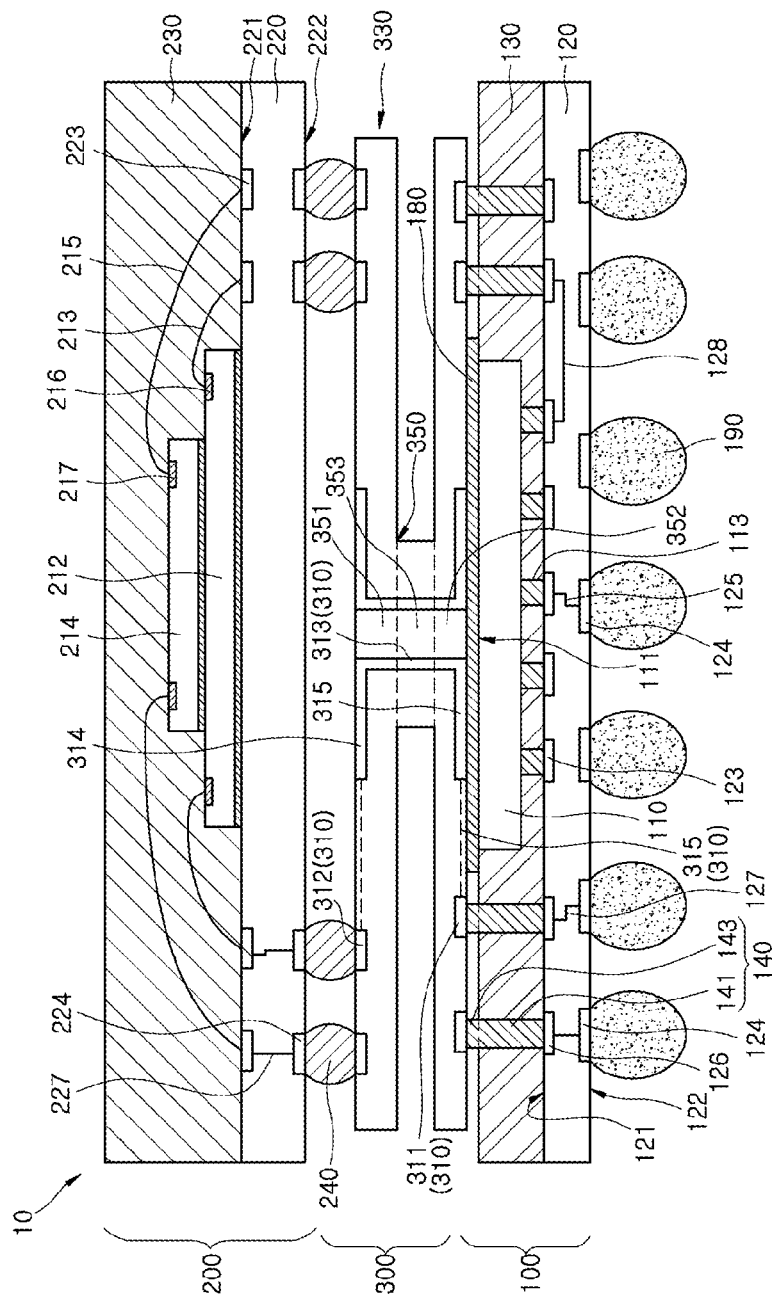
FIG. 1 is a cross-sectional view illustrating a package-on-package (PoP) structural semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. Various embodiments are directed to semiconductor packages including a flexible wing interconnection substrate, memory cards including the same, and electronic systems including the same.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips. The semiconductor chips may be obtained by separating a semiconductor substrate such as a wafer into a plurality of pieces using a die sawing process. The semiconductor chips may correspond to memory chips or logic chips (including application specific integrated circuits (ASIC) chips). The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a figure, the reference numeral may be mentioned or described with reference to another figure. In addition, even though a reference numeral is not shown in a figure, it may be mentioned or described with reference to another figure.

Referring to FIG. 1, a cross-sectional view illustrating a semiconductor package 10 according to an embodiment is described.

In FIG. 1, the semiconductor package 10 may be configured to have a package-on-package (PoP) structure. The PoP structure may include a first semiconductor package 100 corresponding to a bottom semiconductor package and a second semiconductor package 200 corresponding to a top semiconductor package stacked on the bottom semiconductor package. Although FIG. 1 illustrates an example in which the semiconductor package 10 includes the first and second semiconductor packages 100 and 200 sequentially stacked, the invention is not limited thereto. For example, the semiconductor package 10 may further include a third semiconductor package disposed on the second semiconductor package 200 or under the first semiconductor package 100. While a multi-chip package includes a plurality of semiconductor chips, the PoP structure of the semiconductor package 10 may include a plurality of semiconductor packages having a package form. The semiconductor package 10 having the PoP structure may further include a flexible wing interconnection substrate 300 disposed between the first and second semiconductor packages 100 and 200.

The first semiconductor package 100 may be configured to have an individual package form. The first semiconductor package 100 may include a first package substrate 120, a first semiconductor chip 110 mounted on the first package substrate 120, and a first protection layer 130 disposed on the first package substrate 120 to cover and encapsulate the first semiconductor chip 110. The first protection layer 130 may include a dielectric layer covering a first surface 121 of the first package substrate 120. The first protection layer 130 may include an epoxy molding compound (EMC) material. In various embodiments, the first protection layer 130 may be disposed to fully cover the first semiconductor chip 110. However, the first protection layer 130 may be disposed to expose a portion (e.g., a top surface 111) of the first semiconductor chip 110 for efficient radiation of heat generated from the first semiconductor chip 110. The first semiconductor chip 110 may include a logic chip such as an ASIC chip. The first package substrate 120 may include a circuit interconnection structure that electrically couples the first semiconductor chip 110 to an external device or an external system. The first package substrate 120 may also include another circuit interconnection structure that electrically couples the second semiconductor package 200 to an external device or an external system. The first package substrate 120 may be a printed circuit board (PCB). Alternatively, the first package substrate 120 may be an embedded substrate in which the first semiconductor chip 110 is embedded.

The first package substrate 120 may include first trace patterns 123 that are disposed on the first surface 121 thereof to electrically couple the first package substrate 120 to the first semiconductor chip 110. The first trace patterns 123 may be conductive patterns. The first trace patterns 123 may correspond to a portion of a circuit interconnection structure that is disposed on the first surface 121 of the first package substrate 120. The first trace patterns 123 may be landing pads which are electrically coupled to first chip connectors 113 for electrically coupling the first package substrate 120 to the first semiconductor chip 110. The first chip connectors 113 may include conductive bumps. Second trace patterns 124 may be disposed on a second surface 122 of the first package substrate 120 opposite to the first trace patterns 123 to electrically couple the semiconductor package 10 to an external device or an external system. The second trace patterns 124 may be conductive patterns. The second trace patterns 124 may correspond to a portion of a circuit interconnection structure for electrically coupling the first semiconductor package 100 or the semiconductor package 10 to an external device or an external system. The second trace patterns 124 may be contact pads to which outer connectors 190 are attached. First inner connectors 125 may penetrate the first package substrate 120 to electrically couple the first trace patterns 123 to the second trace patterns 124. Each of the first inner connectors 125 may include at least one of an inner trace pattern or a conductive via.

The first package substrate 120 may include third trace patterns 126 that are disposed on the first surface 121 thereof and are electrically coupled to the second semiconductor package 200. The third trace patterns 126 may correspond to a portion of the circuit interconnection structure that is disposed on the first surface 121 of the first package substrate 120. The third trace patterns 126 may be landing pads combined with first package connectors 140 that are electrically coupled to the second semiconductor package 200. Each of the first package connectors 140 may include a first package connection via portion 141 substantially penetrating the first protection layer 130 and a first package connection contact portion 143 disposed on a top portion of the first package connection via portion 141. The first package connection contact portion 143 may be a conductive adhesion layer such as a solder layer. The first package connection via portion 141 may be a conductive pillar or a conductive via that penetrates the first protection layer 130. Each of the first package connectors 140 may be a via substantially penetrating the first protection layer 130. For example, each of the first package connectors 140 may be a through mold via (TMV) substantially penetrating the first protection layer 130.

The third trace patterns 126 may be electrically coupled to some of the second trace patterns 124 disposed on the second surface 122 of the first package substrate 120. Second inner connectors 127 may substantially penetrate the first package substrate 120 to electrically couple the third trace patterns 126 to some of the second trace patterns 124. The second inner connectors 127 may include inner trace patterns and conductive vias. Third inner connectors 128 may be disposed in or on the first package substrate 120 to electrically couple the third trace patterns 126 to the first trace patterns 123. Since the third trace patterns 126 are electrically coupled to the first trace patterns 123 through the third inner connectors 128, the first semiconductor chip 110 of the first semiconductor package 100 may be electrically coupled to a second semiconductor chip 212 and a third semiconductor chip 214 that are disposed in the second semiconductor package 200. Accordingly, the first semiconductor chip 110 may communicate with the second semiconductor chip 212 and the third semiconductor chip 214 using electrical signals.

The second semiconductor package 200 disposed on the first semiconductor package 100 may have a different shape and function from the first semiconductor package 100. Accordingly, the PoP structural semiconductor package 10 may be a single unified package comprised of a plurality of semiconductor chips or a plurality of semiconductor chips having various functions.

The second semiconductor package 200 may include the second semiconductor chip 212. In an embodiment, the second semiconductor package 200 may be configured to include a plurality of semiconductor chips. For example, the second semiconductor package 200 may include the second semiconductor chip 212 and the third semiconductor chip 214 sequentially stacked on a second package substrate 220. The second semiconductor chip 212 may have the same function and shape as the third semiconductor chip 214. However, in various embodiments, the second semiconductor chip 212 may have a different function or a different size from the third semiconductor chip 214. The second semiconductor chip 212 or the third semiconductor chip 214 may be a memory semiconductor chip.

A stack structure of the second and third semiconductor chips 212 and 214 may be mounted on the second package substrate 220. Further, a second protection layer 230 may cover and encapsulate the second and third semiconductor chips 212 and 214 to protect the second and third semiconductor chips 212 and 214. The second protection layer 230 may include a dielectric layer. The second protection layer 230 may include an epoxy molding compound (EMC) material. The second package substrate 220 may include a circuit interconnection structure that electrically couples the second and third semiconductor chips 212 and 214 to the first semiconductor package 100. The second package substrate 220 may be a printed circuit board (PCB). Alternatively, the second package substrate 220 may be an embedded substrate in which the second and third semiconductor chips 212 and 214 are embedded.

The second package substrate 220 may have a third surface 221 on which the second and third semiconductor chips 212 and 214 are mounted. In addition, the second package substrate 220 may also include fourth trace patterns 223 that are disposed on the third surface 221 to electrically couple the second package substrate 220 to the second and third semiconductor chips 212 and 214. The fourth trace patterns 223 may be conductive patterns. The fourth trace patterns 223 may correspond to a portion of a circuit interconnection structure that is disposed on the third surface 221 of the second package substrate 220. The fourth trace patterns 223 may be landing pads which are electrically coupled to second chip connectors 213 and third chip connectors 215 for electrically coupling the second package substrate 220 to the second and third semiconductor chips 210. The second and third chip connectors 213 and 215 may be bonding wires. Alternatively, the second and third chip connectors 213 and 215 may be conductive bumps. First chip contact portions 216 may be disposed on a surface of the second semiconductor chip 212 and may be combined with the second chip connectors 213. The first chip contact portions 216 may be contact pads. Second chip contact portions 217 may be disposed on a surface of the third semiconductor chip 214 and may be combined with the third chip connectors 215. The second chip contact portions 217 may be contact pads.

Fifth trace patterns 224 may be disposed on a fourth surface 222 of the second package substrate 220 opposite to the second and third semiconductor chips 212 and 214 to electrically couple the second package substrate 220 of the second semiconductor package 200 to the first package substrate 120 of the first semiconductor package 100. The fifth trace patterns 224 may correspond to a portion of a circuit interconnection structure for electrically coupling the second semiconductor package 200 to the first semiconductor package 100, the flexible wing interconnection substrate 300, or another device. The fifth trace patterns 224 may be landing pads combined with second package connectors 240. Fourth inner connectors 227 may substantially penetrate the second package substrate 220 to electrically couple the fourth trace patterns 223 to the fifth trace patterns 224. Each of the fourth inner connectors 227 may include at least one of an inner trace pattern or a conductive via.

Each of the second package connectors 240 combined with the fifth trace patterns 224 may be a solder ball, a conductive pillar or a conductive stud.

Referring again to FIG. 1, the flexible wing interconnection substrate 300 may serve as an interconnection member for electrically coupling the first and second semiconductor packages 100 and 200 to each other. An adhesive layer 180 may be disposed between the flexible wing interconnection substrate 300 and the first semiconductor package 100 to attach the first semiconductor package 100 to the flexible wing interconnection substrate 300. The flexible wing interconnection substrate 300 may include a substrate body 330 having a circuit interconnection structure 310 for electrically coupling the first and second semiconductor packages 100 and 200 to each other. The substrate body 330 may include a dielectric material. More specifically, the substrate body 330 may include a flexible material that can be warped or bent by an external force. In various embodiments, the substrate body 330 may include a flexible polymer material such as a polyimide material.

Figure 2:
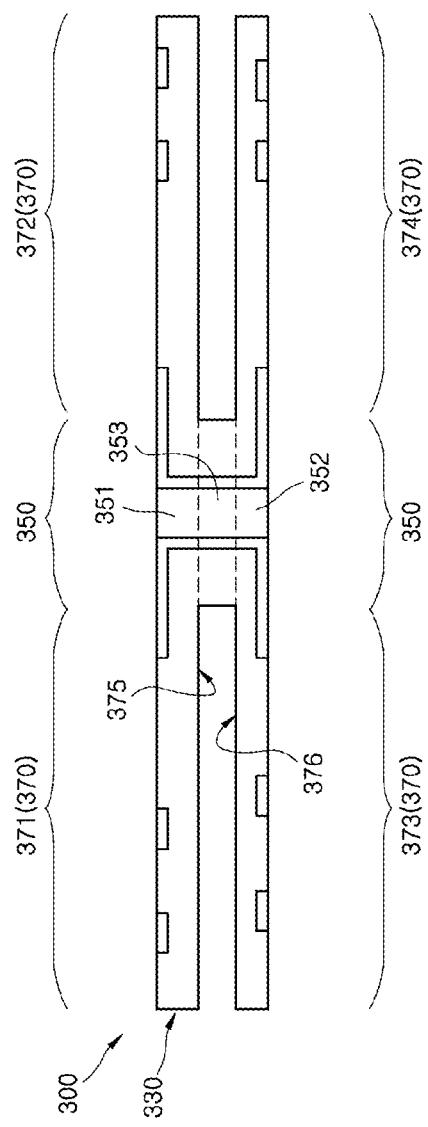
FIGS. 2 to 5 illustrate various shapes of a flexible wing interconnection substrate included in a PoP structural semiconductor package according to an embodiment.
Figure 3:
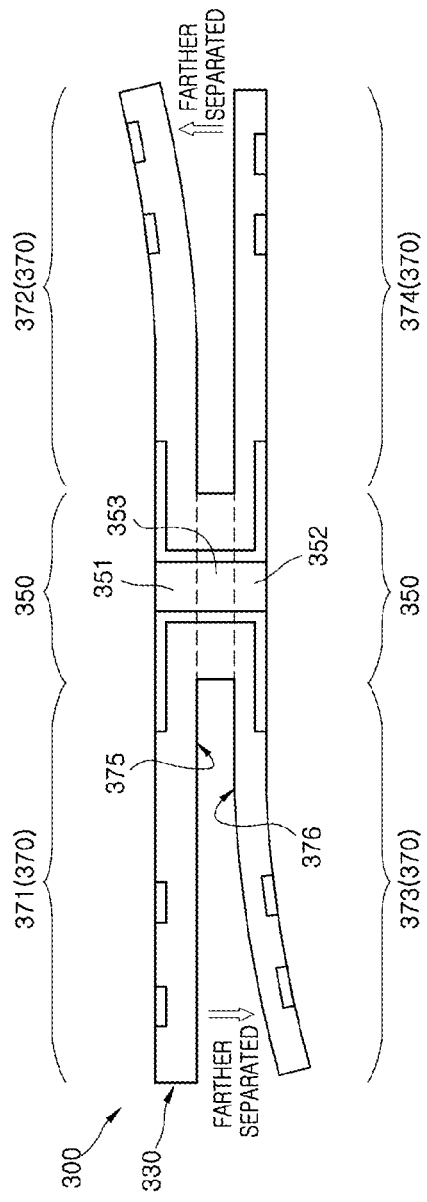

Referring to FIGS. 2 and 3, cross-sectional views illustrating the flexible wing interconnection substrate 300 of FIG. 1 are described.

In FIGS. 1 and 2, the flexible wing interconnection substrate 300 may electrically couple the first and second semiconductor packages 100 and 200 to each other. The flexible wing interconnection substrate 300 may also allow the first semiconductor package 100 to freely move in a vertical direction or in a horizontal direction with respect to the second semiconductor package 200 even while the first and second semiconductor packages 100 and 200 are electrically coupled to each other. The substrate body 330 of the flexible wing interconnection substrate 300 may include a fixing portion 350 and a plurality of flexible wings 370 laterally extending from the fixing portion 350. One end of each of the flexible wings 370 may be fixed to the fixing portion 350, while the other end of each of the flexible wings 370 may extend from the fixing portion 350 outwardly.

The fixing portion 350 may be located at a central portion of the substrate body 330, and the flexible wings 370 may laterally extend from both sidewalls of the fixing portion 350. The fixing portion 350 may include a first fixing portion 351, a second fixing portion 352 located below the first fixing portion 351, and an intermediate connector 353 disposed between the first and second fixing portions 351 and 352. The intermediate connector 353 may combine the first fixing portion 351 with the second fixing portion 352. In various embodiments, the intermediate connector 353 may be combined with the first and second fixing portions 351 and 352 using an adhesive layer. Alternatively, the first and second fixing portions 351 and 352 and the intermediate connector 353 may include the same material to constitute a single unified body without any heterogeneous junction therebetween as illustrated in FIG. 2.

A first flexible wing 371 of the flexible wings 370 may extend from the first fixing portion 351. A second flexible wing 372 of the flexible wings 370 may extend from the first fixing portion 351 in an opposite direction to the first flexible wing 371. A third flexible wing 373 of the flexible wings 370 may extend from the second fixing portion 352 in the same direction as the first flexible wing 371 to be parallel with the first flexible wing 371. A fourth flexible wing 374 of the flexible wings 370 may extend from the second fixing portion 352 in an opposite direction to the third flexible wing 373 to be parallel with the second flexible wing 372. A bottom surface of the first flexible wing 371 facing the third flexible wing 373 may correspond to a first inner surface 375 of the substrate body 330. In addition, a top surface of the third flexible wing 373 facing the first flexible wing 371 may correspond to a second inner surface 376 of the substrate body 330. Thus, the first and second inner surfaces 375 and 376 may face each other, but not bonded to each other. Accordingly, the first and second flexible wings 371 and 372 may face each other and may be spaced apart from each other. As a result, the first and third flexible wings 371 and 373 may be independently warped or bent because each of the first and third flexible wings 371 and 373 includes a flexible material. While at least one of the first and third flexible wings 371 and 373 warps due to an external force such that the first and third flexible wings 371 and 373 are in contact with each other, an end of the first flexible wing 371 (or the third flexible wing 373) may move along a surface of the third flexible wing 373 (or the first flexible wing 371) if both of the first and third flexible wings 371 and 373 additionally warp upward or downward due to the external force. The first and third flexible wings 371 and 373 may be spaced apart from each other by a thickness of the intermediate connector 353 of the fixing portion 350, as illustrated in FIG. 2. However, in various embodiments, a thickness of the intermediate connector 353 may be substantially zero or close to zero. In such a case, the first inner surface 375 of the first flexible wing 371 may be in contact with the second inner surface 376 of the third flexible wing 373. Nevertheless, the first and third flexible wings 371 and 373 may warp due to an external force. This may be because the first and third flexible wings 371 and 373 are not bonded or fixed to each other. The same movement as discussed above is equally applicable to the second and fourth flexible wings 372 and 374.

As illustrated in FIG. 3, the third flexible wing 373 may warp due to an external force to get far from the first flexible wing 371. Similarly, the second flexible wing 372 may warp due to an external force to get far from the fourth flexible wing 374. As such, at last one of the first and third flexible wings 371 and 373 may warp due to an external force such that the first and third flexible wings 371 and 373 get far from each other or closer to each other. Further, at last one of the second and fourth flexible wings 372 and 374 may also warp due to an external force such that the second and fourth flexible wings 372 and 374 get far from each other or closer to each other.

Figure 4:
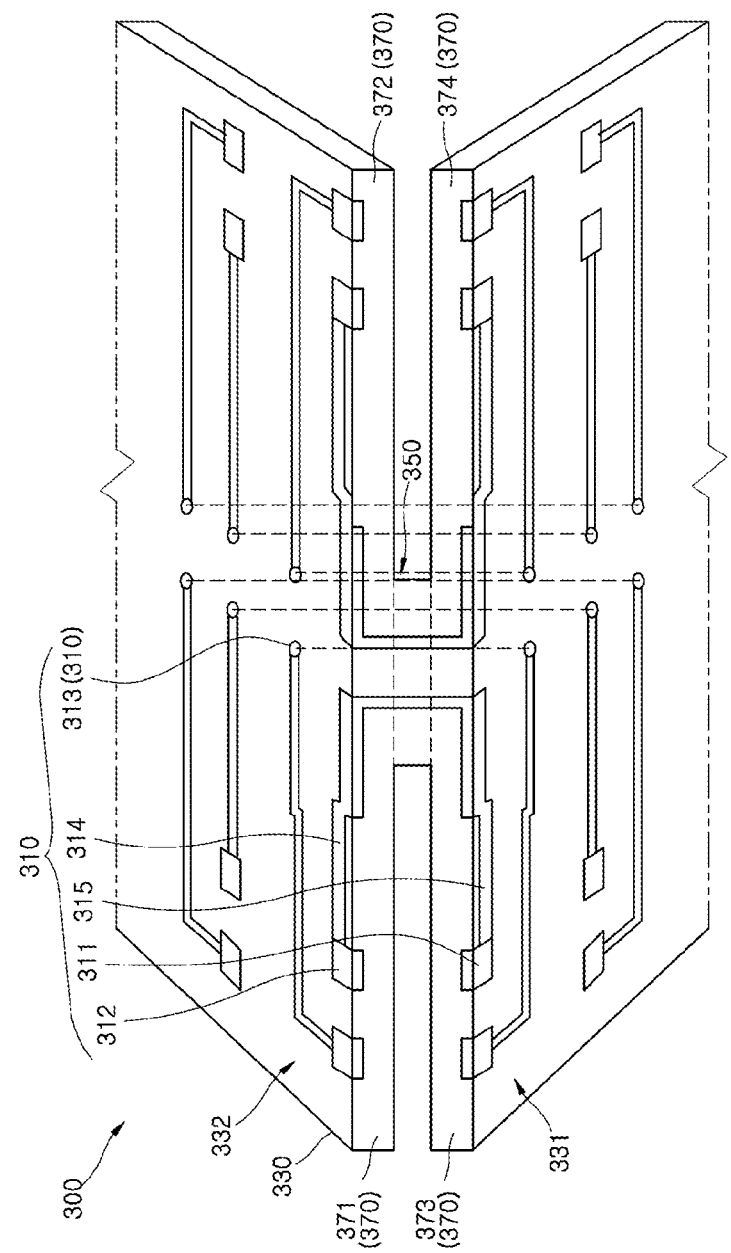

Referring to FIG. 4, an exploded perspective view illustrating the circuit interconnection structure 310 of the flexible wing interconnection substrate 300 included in the semiconductor package 10 of FIG. 1 is described.

In FIGS. 1, 2 and 4, the circuit interconnection structure 310 may be disposed on and in the substrate body 330 of the flexible wing interconnection substrate 300 to electrically couple the first semiconductor package (100 of FIG. 1) to the second semiconductor package (200 of FIG. 1). A first outer surface 331 of the substrate body 330 may face the first semiconductor package 100, and a second outer surface 332 of the substrate body 330 may face the second semiconductor package 200.

Sixth trace patterns 311 may be disposed on the first outer surface 331 of the substrate body 330 and may be electrically coupled to the first semiconductor package 100. The sixth trace patterns 311 may also be referred to as first trace patterns of the substrate body 330. The sixth trace patterns 311 may serve as landing pads or contact pads which are combined with the first package connectors (140 of FIG. 1). Since the first package connectors 140 are combined with the sixth trace patterns 311, the first semiconductor package 100 may be electrically coupled to the flexible wing interconnection substrate 300.

Seventh trace patterns 312 may be disposed on the second outer surface 332 of the substrate body 330 and may be electrically coupled to the second semiconductor package 200. The seventh trace patterns 312 may also be referred to as second trace patterns of the substrate body 330. The seventh trace patterns 312 may serve as landing pads or contact pads which are combined with the second package connectors (240 of FIG. 1). Since the second package connectors 240 are combined with the seventh trace patterns 312, the second semiconductor package 200 may be electrically coupled to the flexible wing interconnection substrate 300.

Through vias 313 may be disposed in the fixing portion 350 of the substrate body 330 to substantially penetrate the fixing portion 350. Eighth trace patterns 315 may be disposed on the first outer surface 331 of the substrate body 330 to electrically couple the through vias 313 to the sixth trace patterns 311. The eighth trace patterns 315 may also be referred to as third trace patterns of the substrate body 330. The eighth trace patterns 315 may be disposed in parallel to respectively connect the sixth trace patterns 311 to the through vias 313.

Ninth trace patterns 314 may be disposed on the second outer surface 332 of the substrate body 330 to electrically couple the through vias 313 to the seventh trace patterns 312. The ninth trace patterns 314 may also be referred to as fourth trace patterns of the substrate body 330. The ninth trace patterns 314 may be disposed in parallel to respectively connect the seventh trace patterns 312 to the through vias 313. The sixth, seventh, eighth and ninth trace patterns 311, 312, 315 and 314 and the through vias 313 may constitute the circuit interconnection structure 310. Further, the circuit interconnection structure 310 may provide electrical paths that electrically couples the second package connectors 240 combined with the second semiconductor package 200 to the first package connectors 140 combined with the first semiconductor package 100.

Figure 5:
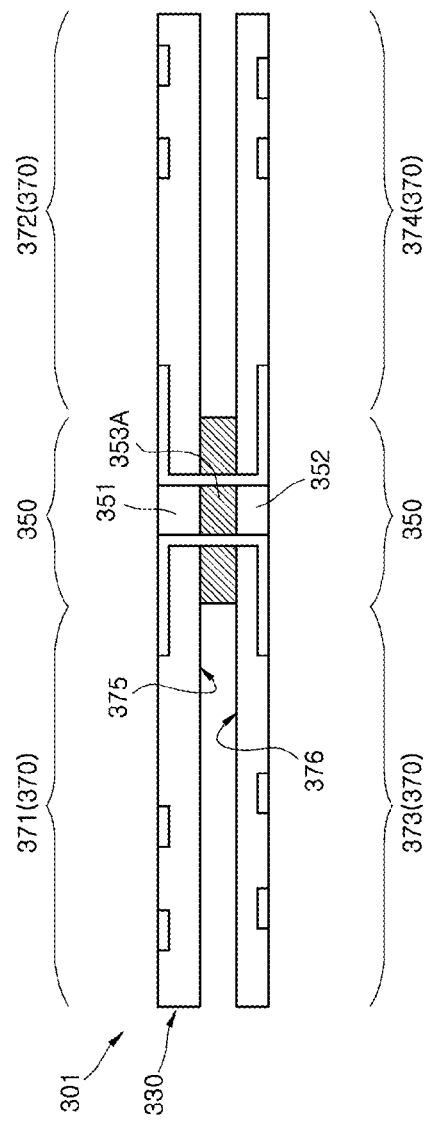

Referring to FIG. 5, a cross-sectional view illustrating another flexible wing interconnection substrate 301 that can replace the flexible wing interconnection substrate 300 shown in FIGS. 2, 3 and 4 is described. In FIG. 5, the same reference numerals as used in FIG. 2 denote the same elements.

In FIGS. 2 and 5, the substrate body 330 of the flexible wing interconnection substrate 301 may include the plurality of flexible wings 370 laterally extending from the fixing portion 350. The fixing portion 350 may be a single unified body including the first fixing portion 351, the second fixing portion 352 and the intermediate connector 353, as illustrated in FIG. 2. However, the fixing portion 350 may be configured to include the first fixing portion 351, the second fixing portion 352, and an intermediate connector 353A comprised of a different material from the first and second fixing portions 351 and 352, as illustrated in FIG. 5. The intermediate connector 353A may include an adhesive layer to combine the first fixing portion 351 with the second fixing portion 352. In such a case, the first fixing portion 351, the first flexible wing 371 and the second flexible wing 372 may constitute a first flexible substrate corresponding to a single unified flexible substrate. Further, the second fixing portion 352, the third flexible wing 373 and the fourth flexible wing 374 may constitute a second flexible substrate corresponding to a single unified flexible substrate. Accordingly, the first flexible substrate and the second flexible substrate may be combined with each other by the adhesive layer of the intermediate connector 353A to constitute the flexible wing interconnection substrate 301. Only central portions of the first and second flexible substrates may be combined with each other by the intermediate connector 353A such that the plurality of flexible wings 370 are farther separated from each other.

Referring again to FIGS. 1 and 2, the semiconductor package 10 may include the first package 100 and the second package 200 stacked on the first package 100, and the flexible wing interconnection substrate 300 may be disposed between the first and the second packages 100 and 200. A portion of the first flexible wing 371 extending from the fixing portion 350 of the flexible wing interconnection substrate 300 may be combined with the second package substrate 220. Further, a portion of the third flexible wing 373 extending from the fixing portion 350 of the flexible wing interconnection substrate 300 may be combined with the first package substrate 120. Similarly, a portion of the second flexible wing 372 extending from the fixing portion 350 of the flexible wing interconnection substrate 300 may be combined with the second package substrate 220. In addition, a portion of the fourth flexible wing 374 extending from the fixing portion 350 of the flexible wing interconnection substrate 300 may be combined with the first package substrate 120.

Figure 6:
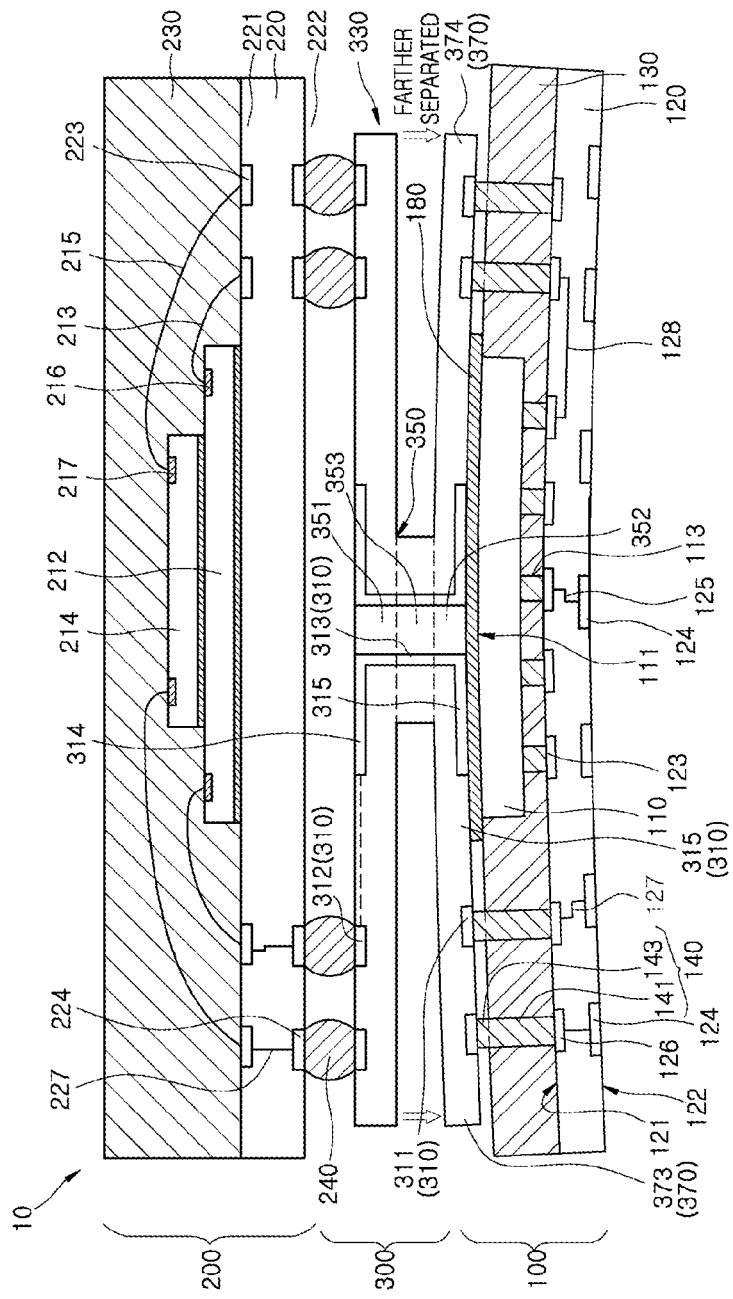
FIG. 6 is a cross-sectional view illustrating a transformed shape of a PoP structural semiconductor package according to an embodiment.
Figure 7:
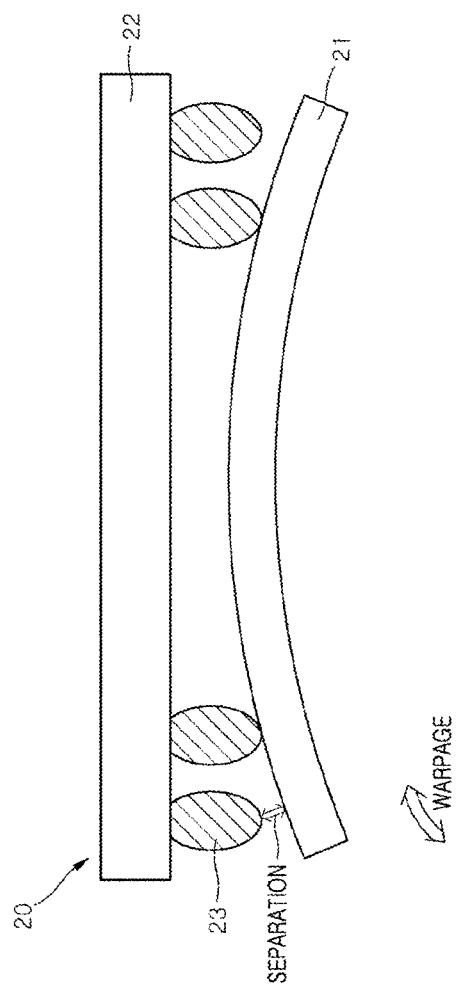
FIG. 7 is a cross-sectional view illustrating a joint failure of a general PoP structural semiconductor package.

Referring to FIG. 6, a cross-sectional view illustrating a transformed shape of the first semiconductor package 100 included in the PoP structural semiconductor package 10 shown in FIG. 1 is described. In addition, FIG. 7 is a cross-sectional view illustrating a joint failure of a general PoP structural semiconductor package 20 is described.

In FIG. 6, only the first semiconductor package 100 of the semiconductor package 10 may warp while the second semiconductor package 200 maintains its original shape without any warpage. A thickness of recent semiconductor packages tends to decrease. Thus, a thickness of the first or second semiconductor package 100 or 200 may also be reduced to realize a compact semiconductor package. If the thickness of the first or second semiconductor package 100 or 200 is reduced, the first or second semiconductor package 100 or 200 may readily warp or bend.

As illustrated in FIG. 6, the first semiconductor package 100 may warp to have a crying shape. The first semiconductor package 100 may warp such that both ends of the first semiconductor package 100 are located at a lower level than a central portion of the first semiconductor package 100. When the first semiconductor package 100 warps, the third and fourth flexible wings 373 and 374 of the flexible wing interconnection substrate 300 may also warp according to a shape of the warped first semiconductor package 100. Accordingly, the sixth trace patterns 311 disposed on the third and fourth flexible wings 373 and 374 may still be electrically coupled to the first package connectors 140 even if the first semiconductor package 100 warps.

Positions of the first package connectors 140 may change when the first semiconductor package 100 warps. When the first semiconductor package 100 warps, the third and fourth flexible wings 373 and 374 may also warp to change the positions of the sixth trace patterns 311 disposed on the third and fourth flexible wings 373 and 374. The first package connectors 140 may move when the first semiconductor package 100 warps. In addition, the third and fourth flexible wings 373 and 374 may also warp when the first semiconductor package 100 warps. Thus, the sixth trace patterns 311 and the first package connectors 140 may simultaneously move together when the first semiconductor package 100 warps. A stress applied to joint portions of the sixth trace patterns 311 and the first package connectors 140 with the warpage of the first semiconductor package 100 may be alleviated or relieved by warpage of the third and fourth flexible wings 373 and 374. Thus, when the first semiconductor package 100 warps, contact failure between the sixth trace patterns 311 and the first package connectors 140 may be suppressed or prevented by alleviation of the stress applied to the joint portions of the sixth trace patterns 311 and the first package connectors 140. Even though the first semiconductor package 100 warps, the sixth trace patterns 311 may still be electrically coupled to the first package connectors 140.

As illustrated in FIG. 7, a first semiconductor package 21 and a second semiconductor package 22 constituting the general semiconductor package 20 may be combined with each other by rigid connectors 23 such as solder balls. In such a case, nothing can relieve or alleviate a stress applied to the connectors 23 when the first semiconductor package 21 warps. Thus, contact failure between the connectors 23 and the first semiconductor package 21 may occurs when the first semiconductor package 21 warps. However, the semiconductor package 10 illustrated in FIGS. 1 to 6 may prevent or suppress the contact failure between the first semiconductor package 100 and the flexible wing interconnection substrate 300 even though the first semiconductor package 100 warps.

Figure 8:
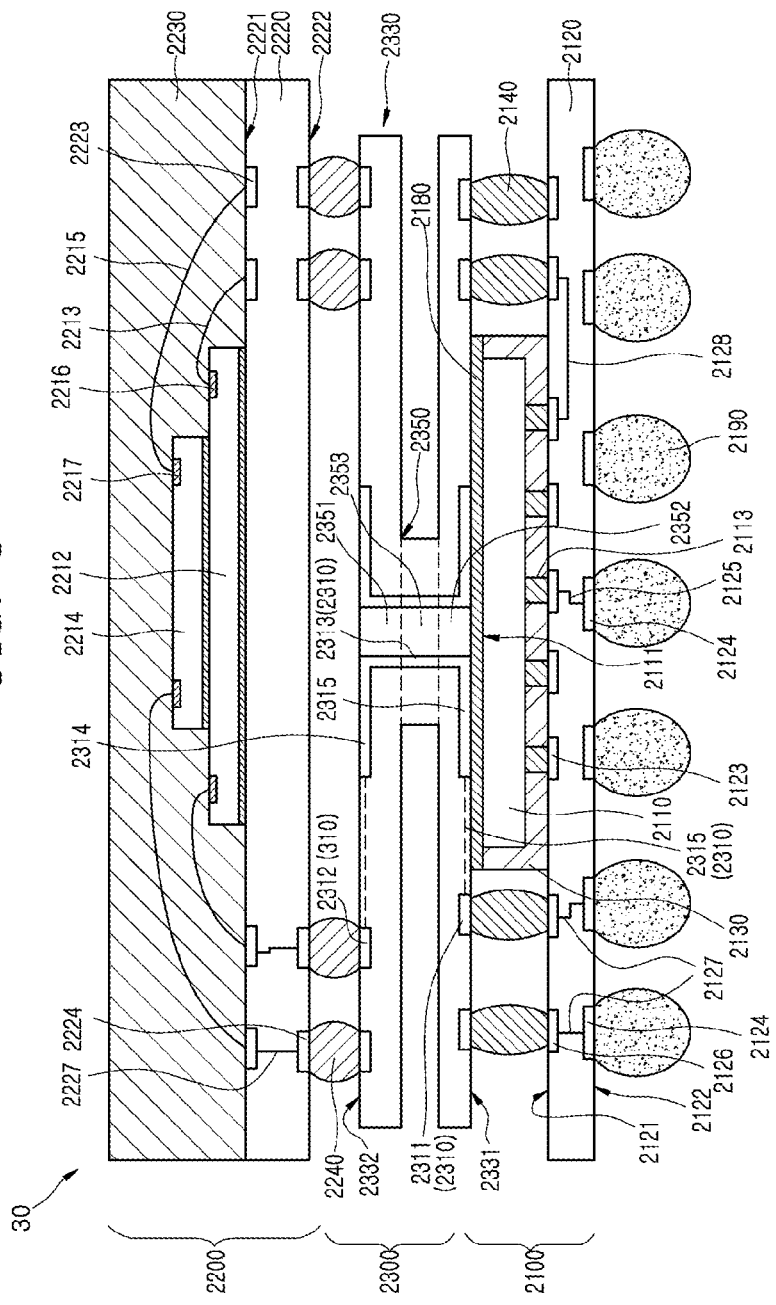
FIG. 8 is a cross-sectional view illustrating a package-on-package (PoP) structural semiconductor package according to an embodiment.

Referring to FIG. 8, a cross-sectional view illustrating a PoP structural semiconductor package 30 according to an embodiment is described.

In FIG. 8, the semiconductor package 30 may be configured to include a first semiconductor package 2100, a second semiconductor package 2200 stacked on the first semiconductor package 2100, and a flexible wing interconnection substrate 2300 disposed between the first and second semiconductor packages 2100 and 2200 to electrically couple the first and second semiconductor packages 2100 and 2200 to each other. The flexible wing interconnection substrate 2300 and the first semiconductor package 2100 may be combined with each other by first package connectors 2140, and the first package connectors 2140 may be solder balls that do not have a through molding via (TMV) shape. A first package substrate 2120 of the first semiconductor package 2100 may be combined with the flexible wing interconnection substrate 2300 by the first package connectors 2140 such as solder balls. Accordingly, the first package substrate 2120 may be electrically coupled to the flexible wing interconnection substrate 2300. Each of the first package connectors 2140 may be comprised of a single solder ball. However, in various embodiments, each of the first package connectors 2140 may include a plurality of stacked solder balls to increase a height thereof. Alternatively, each of the first package connectors 2140 may include a metal stud or a conductive pillar.

The first semiconductor package 2100 may include the first package substrate 2120, a first semiconductor chip 2110 mounted on the first package substrate 2120, and a first protection layer 2130 disposed on the first package substrate 2120 to cover and encapsulate the first semiconductor chip 2110. The first protection layer 2130 may not cover a portion of the first package substrate 2120 to expose the first package connectors 2140. The first protection layer 2130 may include a dielectric layer, for example, an epoxy molding compound (EMC) material. In various embodiments, the first protection layer 2130 may be disposed to fully cover the first semiconductor chip 2110. Alternatively, the first protection layer 2130 may be disposed to expose a portion (e.g., a top surface 2111) of the first semiconductor chip 2110 for efficient radiation of heat generated from the first semiconductor chip 2110.

The first package substrate 2120 may include a circuit interconnection structure. More specifically, first trace patterns 2123 may be disposed on a first surface 2121 of the first package substrate 2120 and may be electrically coupled to the first semiconductor chip 2110. The first trace patterns 2123 may be conductive patterns. The first trace patterns 2123 may be landing pads which are connected to first chip connectors 2113 for electrically coupling the first package substrate 2120 to the first semiconductor chip 2110. Second trace patterns 2124 may be disposed on a second surface 2122 of the first package substrate 2120 opposite to the first trace patterns 2123. Outer connectors 2190 may be attached to the second trace patterns 2124. First inner connectors 2125 may be disposed in the first package substrate 2120 to electrically couple the first trace patterns 2123 to the second trace patterns 2124.

The first package substrate 2120 may include third trace patterns 2126 disposed on the first surface 2121 thereof. The first package connectors 2140 may be electrically coupled to the third trace patterns 2126. The third trace patterns 2126 may be electrically coupled to some of the second trace patterns 2124. Second inner connectors 2127 may substantially penetrate the first package substrate 2120 to electrically couple the third trace patterns 2126 to some of the second trace patterns 2124. Third inner connectors 2128 may be disposed in or on the first package substrate 2120 to electrically couple the third trace patterns 2126 to the first trace patterns 2123.

The second semiconductor package 2200 may include a second semiconductor chip 2212. The second semiconductor package 2200 may further include a third semiconductor chip 2214 stacked on the second semiconductor chip 2212. A stack structure of the second and third semiconductor chips 2212 and 2214 may be mounted on a second package substrate 2220. Further, a second protection layer 2230 may cover and encapsulate the second and third semiconductor chips 2212 and 2214 to protect the second and third semiconductor chips 2212 and 2214. The second package substrate 2220 may include a circuit interconnection structure. More specifically, the second package substrate 2220 may have a third surface 2221 on which the second and third semiconductor chips 2212 and 2214 are mounted. In addition, fourth trace patterns 2223 may be disposed on the third surface 2221 to electrically couple the second package substrate 2220 to the second and third semiconductor chips 2212 and 2214. Some of the fourth trace patterns 2223 may be electrically coupled to second chip connectors 2213, and the others of the fourth trace patterns 2223 may be electrically coupled to third chip connectors 2215. The second chip connectors 2213 may extend to be electrically coupled to first chip contact portions 2216 disposed on a surface of the second semiconductor chip 2212. The third chip connectors 2215 may extend to be electrically coupled to second chip contact portions 2217 disposed on a surface of the third semiconductor chip 2214. The second and third connectors 2213 and 2215 may be bonding wires.

Fifth trace patterns 2224 may be disposed on a fourth surface 2222 of the second package substrate 2220 opposite to the second and third semiconductor chips 2212 and 2214. The fifth trace patterns 2224 may be combined with second package connectors 2240. Fourth inner connectors 2227 may substantially penetrate the second package substrate 2220 to electrically couple the fourth trace patterns 2223 to the fifth trace patterns 2224.

The flexible wing interconnection substrate 2300 may be provided to serve as an interconnection member for electrically coupling the first and second semiconductor packages 2100 and 2200 to each other. An adhesive layer 2180 may be disposed between the flexible wing interconnection substrate 2300 and the first semiconductor package 2100 to attach the first semiconductor package 2100 to the flexible wing interconnection substrate 2300. The flexible wing interconnection substrate 2300 may include a substrate body 2330 having a circuit interconnection structure 2310. The substrate body 2330 of the flexible wing interconnection substrate 2300 may include a fixing portion 2350 and a plurality of flexible wings 2370 laterally extending from the fixing portion 2350. The fixing portion 2350 may include a first fixing portion 2351, a second fixing portion 2352 located below the first fixing portion 2351, and an intermediate connector 2353 disposed between the first and second fixing portions 2351 and 2352. The substrate body 2330 may have a first outer surface 2331 facing the first semiconductor package 2100 and a second outer surface 2332 facing the second semiconductor package 2200. Sixth trace patterns 2311 may be disposed on the first outer surface 2331 of the substrate body 2330 and may be electrically coupled to the first semiconductor package 2100 through the first package connectors 2140. Seventh trace patterns 2312 may be disposed on the second outer surface 2332 of the substrate body 2330 and may be electrically coupled to the second semiconductor package 2200 through the second package connectors 2240. Through vias 2313 may be disposed in the fixing portion 2350 of the substrate body 2330 to substantially penetrate the fixing portion 2350. Eighth trace patterns 2315 may be disposed on the first outer surface 2331 of the substrate body 2330 to electrically couple the through vias 2313 to the sixth trace patterns 2311. Ninth trace patterns 2314 may be disposed on the second outer surface 2332 of the substrate body 2330 to electrically couple the through vias 2313 to the seventh trace patterns 2312. The sixth, seventh, eighth and ninth trace patterns 2311, 2312, 2315 and 2314 and the through vias 2313 may constitute the circuit interconnection structure 2310.

Figure 9:
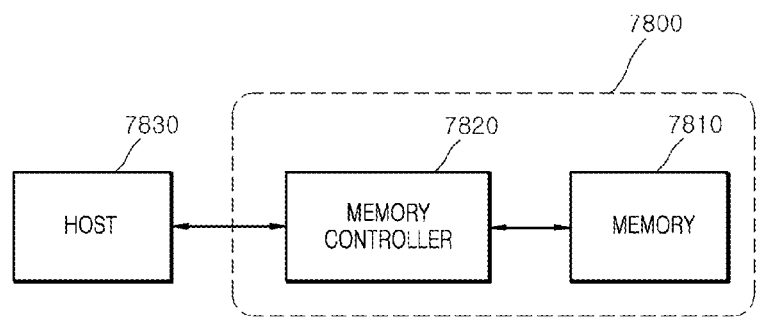
FIG. 9 is a block diagram illustrating an electronic system employing a memory card including at least one of packages in accordance with some embodiments.

Referring to FIG. 9, a block diagram illustrating an electronic system including a memory card 7800 including at least one semiconductor package according to an embodiment is described. The memory card 7800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in an embedded package according to an embodiment.

The memory 7810 may include a nonvolatile memory device to which the technology of the embodiments of the invention is applied. The memory controller 7820 may control the memory 7810 such that stored data is read out or data is stored in response to a read/write request from a host 7830.

Figure 10:
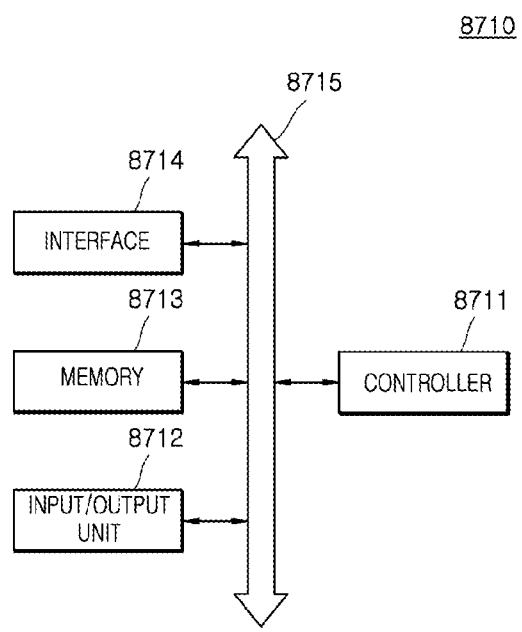
FIG. 10 is a block diagram illustrating an electronic system including at least one of packages according to some embodiments.

Referring to FIG. 10, a block diagram illustrating an electronic system 8710 including at least one package according to an embodiment is described. The electronic system 8710 may include a controller 8711, an input/output device 8712, and a memory 8713. The controller 8711, the input/output device 8712 and the memory 8713 may be electrically coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the invention. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the invention have been disclosed for illustrative purposes. Those skilled in the art will appreciate that various modifications, additions and substitutions are possible, without departing from the scope and spirit of the invention and the accompanying claims.

What is claimed is:

1. A semiconductor package comprising:
  a first semiconductor package and a second semiconductor package disposed over the first semiconductor package; and
  a flexible wing interconnection substrate disposed between the first and second semiconductor packages,
  wherein the flexible wing interconnection substrate comprises:
    a fixing portion;
    a first flexible wing extending from the fixing portion, with a portion of the first flexible wing being combined with the second semiconductor package;
    a second flexible wing extending from the fixing portion to be parallel with the first flexible wing, with a portion of the second flexible wing being combined with the first semiconductor package,
a third flexible wing extending from the fixing portion in an opposite direction to the first flexible wing;
a fourth flexible wing extending from the fixing portion in an opposite direction to the second flexible wing to be parallel with the third flexible wing.

2. The semiconductor package of claim 1, wherein the flexible wing interconnection substrate further comprises:
a through via penetrating the fixing portion and including a conductive material;
a first trace pattern disposed on the first flexible wing and electrically coupled to the second semiconductor package;
a second trace pattern disposed on the second flexible wing and electrically coupled to the first semiconductor package;
a third trace pattern electrically coupling the first trace pattern to the though via; and
a fourth trace pattern electrically coupling the second trace pattern to the though via.

3. The semiconductor package of claim 1,
wherein the fixing portion of the flexible wing interconnection substrate comprises:
a first fixing portion from which the first flexible wing extends;
a second fixing portion from which the second flexible wing extends; and
an intermediate connector located between the first fixing portion and the second fixing portion, and
wherein the first fixing portion, the second fixing portion and the intermediate connector include the same material to constitute a single unified body.

4. The semiconductor package of claim 1, wherein the fixing portion of the flexible wing interconnection substrate comprises:
a first fixing portion from which the first flexible wing extends;
a second fixing portion from which the second flexible wing extends; and
an adhesive layer bonding the first fixing portion to the second fixing portion.

5. The semiconductor package of claim 1, wherein the first flexible wing is spaced apart from the second flexible wing to be movable.

6. The semiconductor package of claim 1, wherein the first flexible wing is in contact with a surface of the second flexible wing and is movable along the surface of the second flexible wing.

7. The semiconductor package of claim 1, wherein each of the first and second flexible wings include a flexible material which is capable of warping or bending.

8. The semiconductor package of claim 1, wherein the fixing portion of the flexible wing interconnection substrate supports the first and second flexible wings.

9. The semiconductor package of claim 1, wherein the first semiconductor package comprises:
a package substrate;
a semiconductor chip mounted on the package substrate;
a protection layer disposed on the package substrate to encapsulate the semiconductor chip; and
a package connector penetrating the protection layer to electrically couple the package substrate to the first flexible wing.

10. The semiconductor package of claim 9, wherein the package connector is a through mold via (TMV).

11. The semiconductor package of claim 1, wherein the first semiconductor package comprises:
a package substrate;
a semiconductor chip mounted on the package substrate;
a protection layer covering the semiconductor chip and exposing a portion of a surface of the package substrate; and
a package connector combined with the exposed surface of the package substrate to electrically couple the package substrate to the first flexible wing.

12. The semiconductor package of claim 11, wherein the package connector includes a solder ball.

13. A semiconductor package comprising:
a first package substrate and a second package substrate disposed on the first package substrate; and
a flexible wing interconnection substrate disposed between the first and second package substrates,
wherein the flexible wing interconnection substrate comprises:
a fixing portion;
a first flexible wing extending from the fixing portion, with a portion of the first flexible wing combined with the second package substrate;
a second flexible wing extending from the fixing portion to be parallel with the first flexible wing, with a portion of the second flexible wing combined with the first package substrate,
a third flexible wing extending from the fixing portion in an opposite direction to the first flexible wing;
a fourth flexible wing extending from the fixing portion in an opposite direction to the second flexible wing to be parallel with the third flexible wing.

14. The semiconductor package of claim 13, wherein the flexible wing interconnection substrate further comprises:
a though via penetrating the fixing portion and including a conductive material;
a first trace pattern disposed on the first flexible wing and electrically coupled to the second package substrate;
a second trace pattern disposed on the second flexible wing and electrically coupled to the first package substrate;
a third trace pattern electrically coupling the first trace pattern to the though via; and
a fourth trace pattern electrically coupling the second trace pattern to the though via.

15. The semiconductor package of claim 14, further comprising:
a first package connector that electrically couples the second trace pattern to the first package substrate.

16. The semiconductor package of claim 15, further comprising:
a first semiconductor chip mounted on the first package substrate; and
a protection layer disposed on the first package substrate to encapsulate the first semiconductor chip,
wherein the first package connector includes a through mold via (TMV) penetrating the first protection layer.

17. The semiconductor package of claim 15, further comprising:
a second package connector that electrically couples the first trace pattern to the second package substrate.

18. The semiconductor package of claim 17, wherein the second package connector includes a solder ball.

19. The semiconductor package of claim 16, further comprising:
a second semiconductor chip mounted on the second package substrate; and a bonding wire electrically coupling the second semiconductor chip to the second package substrate.

* * * * *